United States Patent

Lyons et al.

[11] Patent Number: 6,121,123
[45] Date of Patent: *Sep. 19, 2000

[54] GATE PATTERN FORMATION USING A BARC AS A HARDMASK

[75] Inventors: Christopher F. Lyons, Fremont; Scott A. Bell; Olov Karlsson, both of San Jose, all of Calif.

[73] Assignee: Advanced Micro Devices, Inc., Sunnyvale, Calif.

[*] Notice: This patent is subject to a terminal disclaimer.

[21] Appl. No.: 08/924,573

[22] Filed: Sep. 5, 1997

[51] Int. Cl.$^7$ .................. H01L 21/3205; H01L 21/4763
[52] U.S. Cl. .................. 438/585; 438/952; 438/717; 438/736
[58] Field of Search ............................................. 438/585

[56] References Cited

U.S. PATENT DOCUMENTS

| | | |
|---|---|---|
| 5,431,770 | 7/1995 | Lee et al. . |
| 5,545,578 | 8/1996 | Park et al. . |
| 5,567,631 | 10/1996 | Hsu et al. . |
| 5,580,700 | 12/1996 | Rahman . |
| 5,600,165 | 2/1997 | Tsukamoto et al. . |
| 5,620,912 | 4/1997 | Hwang et al. . |
| 5,801,399 | 9/1998 | Hattori et al. . |
| 5,841,179 | 11/1998 | Pramanick et al. . |
| 5,846,878 | 12/1998 | Horiba . |
| 5,880,508 | 3/1999 | Wu . |
| 5,902,125 | 5/1999 | Wu . |
| 5,920,796 | 7/1999 | Wang et al. . |
| 5,963,841 | 10/1999 | Karlsson et al. . |
| 5,965,461 | 10/1999 | Yang et al. . |

*Primary Examiner*—John F. Niebling
*Assistant Examiner*—Jonathan Hack

[57] ABSTRACT

A gate is formed on a semiconductor substrate by using a SiON film as both a bottom anti-reflective coating (BARC) and subsequently as a hardmask to better control the critical dimension (CD) of the gate as defined via a deep-UV resist mask formed thereon. The wafer stack includes a gate oxide layer over a semiconductor substrate, a polysilicon gate layer over the gate oxide layer, and a SiON film over the conductive layer. The resist mask is formed on the SiON film. The SiON film improves the resist mask formation process and then serves as a hardmask during subsequent etching processes. Then the wafer stack is shaped to form one or more polysilicon gates by sequentially etching through selected portions of the SiON film and the gate conductive layer as defined by the etch windows in the original resist mask. Once the gate has been properly shaped, any remaining portions of either the resist mask or the SiON film are then removed.

14 Claims, 1 Drawing Sheet

GATE PATTERN FORMATION USING A BARC AS A HARDMASK

TECHNICAL FIELD

The present invention relates to semiconductor devices and manufacturing processes, and more particularly to methods for forming conductive gates within a semiconductor device.

BACKGROUND ART

A continuing trend in semiconductor technology is to build integrated circuits with more and/or faster semiconductor devices. The drive toward this ultra large scale integration, has resulted in continued shrinking of device and circuit dimensions and features. In integrated circuits having field-effect transistors, for example, one very important process step is the formation of the gate for each of the transistors, and in particular the dimensions of the gate. In many applications, the performance characteristics (e.g., switching speed) and size of the transistor are functions of the size (e.g., width) of the transistor's gate. Thus, for example, a narrower gate tends to produce a higher performance transistor (e.g., faster) that is inherently smaller in size (e.g., narrower width).

As is often the case, however, there are limitations to existing techniques that reduce their effectiveness or even exclude their use in fabricating the next generation of integrated circuit devices. For example, the limitations of conventional lithographic techniques and tools, which are used to pattern the gates during fabrication, are quickly being realized. Accordingly, there is a continuing need for more efficient and effective fabrication processes for forming transistor gates that are smaller and/or exhibit higher performance.

SUMMARY OF THE INVENTION

The present invention provides a method for forming a gate on a semiconductor substrate by using a thin film as both a bottom anti-reflective coating (BARC) and hardmask so as to better control the critical dimension (CD) of the gate as defined by the pattern from a resist mask.

In an embodiment of the present invention, the method includes creating a wafer stack by forming a dielectric layer over the substrate, depositing a conductive layer over the dielectric layer, depositing a bottom anti-reflective coating over the conductive layer, and forming a resist mask on the bottom anti-reflective coating. Next, the method includes shaping the wafer stack by sequentially etching through selected portions of the bottom anti-reflective coating as defined by one or more etch windows in the resist mask, and the gate conductive layer as defined by the corresponding extended etch windows as etched through in the bottom anti-reflective coating. The method also includes removing any remaining portions of the resist mask and the bottom anti-reflective coating.

In certain embodiments, the bottom anti-reflective coating (BARC) includes silicon-rich material, such as, for example, a silicon-rich oxide, nitride and/or oxy-nitride, which is applied on top of gate conductive layer. The BARC is configured to suppress reflection of particular wavelengths that are often produced by one or more underlying layers during resist patterning. The BARC is also used as a hardmask once the resist pattern is transferred to the BARC. This allows for a thinner resist layer to be used and a higher density layout to be fabricated by providing better patterning processes and thereby allowing smaller gates to be formed. Furthermore, the BARC also acts as a barrier layer between the gate conductive layer and the resist material.

The foregoing and other features, aspects and advantages of the present invention will become more apparent from the following detailed description of the present invention when taken in conjunction with the accompanying drawings.

BRIEF DESCRIPTION OF THE DRAWINGS

The present invention is illustrated by way of example, and not by way of limitation, in the figures of the accompanying drawings and in which like reference numerals refer to similar elements in which.

DETAILED DESCRIPTION OF THE EXEMPLARY EMBODIMENTS

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit device during fabrication are not drawn to scale, but instead are drawn so as to illustrate the important features of the present invention.

In accordance with an embodiment of the present invention, there is provided a process for forming at least one gate conductor within an integrated circuit using a CVD film, such as, for example, silicon oxynitride (e.g., $SiO_xN_y$, referred to hereinafter as SiON) film, as both a bottom anti-reflective coating (BARC) and hardmask. The process, in accordance with the present invention, the use of a hardmask eliminates the need to use a thick resist mask which allows for better critical dimension (CD) uniformity across varying circuit densities, and increases the depth of focus during resist patterning. As such, the present invention also provides better process control over the gate formation and has the added benefit of reducing the potential for defects traceable to the use of an organic spin-on BARC.

Figure 1:
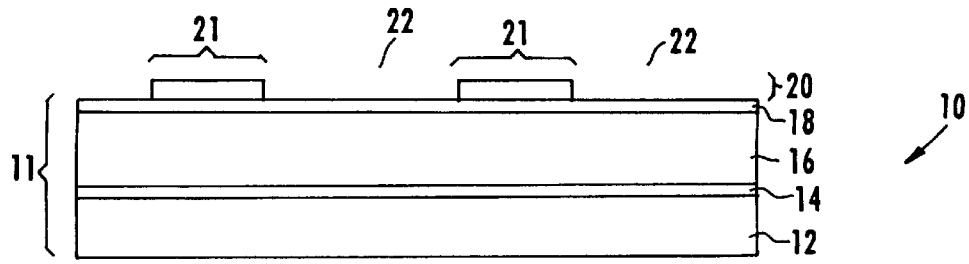
FIG. 1 depicts a cross-section of a portion of a semiconductor wafer which has been prepared for gate conductor formation, in accordance with an embodiment of the present invention.

FIG. 1 depicts a cross-section of a portion 10 of a semiconductor device being fabricated on a semiconductor wafer, in accordance with the present invention. Portion 10 includes a wafer stack 11 having a substrate 12, a gate dielectric 14, a gate conductive layer 16, and a BARC/hardmask 18. As depicted, there is also a resist mask 20 that has been patterned on top of BARC/hardmask 18. In accordance with certain embodiments of the present invention, substrate 12 includes a heavily-doped silicon layer, approximately 2 mm thick, and a lightly-doped epitaxial (epi) layer, approximately 4 $\mu$m thick, which is grown on the heavily-doped silicon layer. Gate dielectric layer 14 acts as a barrier between gate conductive layer 16 and substrate 12. In an exemplary embodiment of the present invention, gate dielectric layer 14 is an oxide layer, approximately 55 Å thick, which is formed on top of substrate 12. Gate conductive layer 16, in the exemplary embodiment, is a layer of polycrystalline silicon, approximately 1,700 Å thick, which is formed on top of gate dielectric layer 14. Gate conductor 16 in other embodiments is an amorphous silicon, aluminum (Al), tungsten (W), titanium, and/or suicides of these metals.

BARC/hardmask 18, which is preferably SiON or a similar silicon-rich material, is then applied on top of gate conductive layer 16. By way of example, BARC/hardmask 18 in certain embodiments can be a silicon-rich oxide, nitride or oxy-nitride. The benefits of using a BARC are known in the art. For example, a BARC can be tuned to suppress reflection of a particular wavelength produced by one or more underlying layers during subsequent resist patterning process steps. Thus, as discussed in greater detail below, when combined with the proper lithographic techniques, the BARC/hardmask 18 of the present invention allows for a higher density layout to be fabricated by providing better patterning processes and thereby allowing smaller gates to be formed. Furthermore, BARC/hardmask 18 acts as a barrier layer between gate conductive layer 16 and resist mask 20.

BARC/hardmask 18, in accordance with the present invention is preferably an inorganic layer that is deposited over gate conductive layer 16, such as, for example, SiON, silicon oxime (e.g., $Si_{(1-x+y+z)}N_xO_y:H_z$), or silicon nitride (e.g., $Si_3N_4$). BARC/hardmask 18, in an exemplary embodiment, is a thin layer of SiON tuned, through process conditions, to absorb deep-UV wavelengths (e.g., 248 nm) during the creation of resist mask 20 using conventional deep-UV lithography techniques. The deposition of BARC/hardmask 18, such as for example, through conventional CVD techniques, creates a more uniform layer than a typical spin-on organic BARC material. This tends to provide better process control over the traditional spin-on techniques that are often harder to control and more likely to introduce defects, such as, for example, through contaminants. In a preferred embodiment, BARC/hardmask 18 is an SiON layer that has been deposited using PECVD or LPCVD.

Next, resist mask 20, such as, for example, a deep-UV resist mask, is applied to BARC/hardmask 18 to define one or more etch windows 22 in the pattern that will be transferred to BARC/hardmask 18 for use in forming one or more gates from gate conductive layer 16. Preferably, resist mask 20 is a thin mask approximately 500 to 2500 Å thick, so as to increase process control and reduce the CD of the gates being formed by taking advantage of BARC/hardmask 18. As shown, resist mask 20 defines line widths 21 that correspond to the desired width of the gates to be formed within stack 11.

Figure 2:
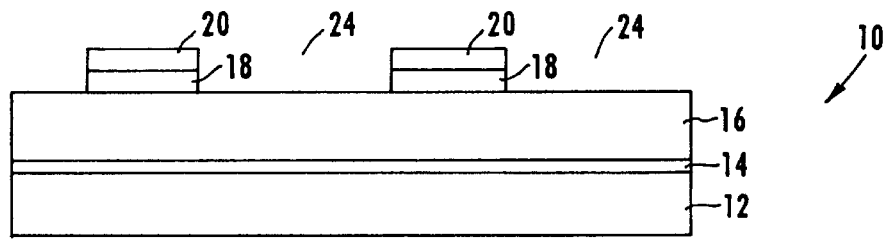
FIG. 2 depicts a cross-section of the portion of FIG. 1 following a selective BARC etching process, in accordance with an embodiment of the present invention.

FIG. 2 depicts portion 10 of FIG. 1 following a BARC etching process in which the pattern of resist mask 20 is essentially transferred to BARC/hardmask 18 by anisotropically etching away exposed portions of BARC/hardmask 18, for example, through etch windows 22. As depicted, the BARC etching process creates extended etch windows 24 which leave selected portions of gate conductive layer 16 exposed. Therefore, the BARC etching process preferably exhibits a high-selectivity to the material in gate conductive layer 16.

Figure 3:
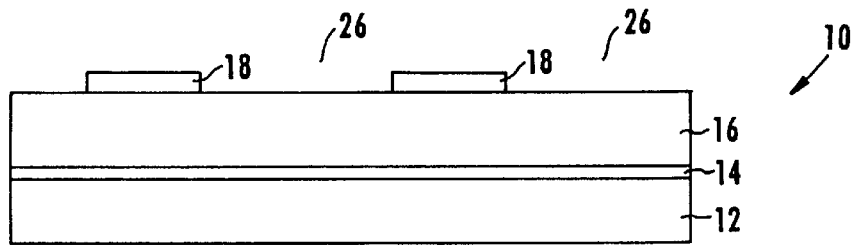
FIG. 3 depicts a cross-section of the portion of FIG. 2 following a resist mask removal process, in accordance with an embodiment of the present invention.

In FIG. 3, portion 10 of FIG. 2 has had the remaining portions of resist mask 20 stripped, for example, using conventional wet resist strip techniques. Alternatively, as in other embodiments of the present invention, resist mask 20 can be left in place and etched away during a subsequent gate conductor etching process, as described below.

Figure 4:
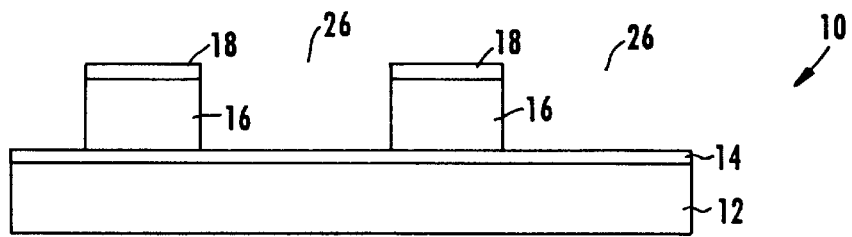
FIG. 4 depicts a cross-section of the portion of FIG. 3 following a gate conductive layer etching process using the patterned BARC of FIGS. 2 and 3 as a hardmask, in accordance with an embodiment of the present invention.

FIG. 4 depicts portion 10 of FIG. 3 following a gate conductive layer etching process in which etched openings 26 are created through extended etch windows 24 and extend through gate conductive layer 16 to gate dielectric layer 14. As depicted, the gate conductive layer etching process, which is preferably an anisotropic etching process, removed selected portions of gate conductive layer 16 located substantially below etch windows 24. BARC/hardmask 18 protects gate conductive layer 16 during this anisotropic etching. By way of example, if gate conductive layer 16 is a layer of polysilicon then the gate conductive layer etching process will preferably have a high-selectivity to the material of gate dielectric layer 14, such as, for example, oxide. Additionally, if resist mask 20 has not been previously stripped then the gate conductive layer etching process, in accordance with an embodiment of the present invention also etches away the remaining portions of resist mask 20.

Figure 5:
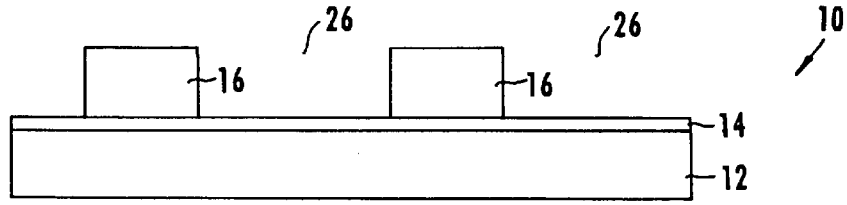
FIG. 5 depicts a cross-section of the portion of FIG. 4 following a second BARC etching process, in accordance with an embodiment of the present invention.

Similarly, in FIG. 5, portion 10 of FIG. 4 has been processed, as in the previous BARC etching process, to remove the remaining portions of BARC/hardmask 18. As a result, the remaining portions of gate conductive layer 16 form gates that can then be used to form completed transistors in subsequent processes.

Thus, by using this novel process, which includes a dual purpose BARC/hardmask 18, to form gates in accordance with the present invention, reduced gate and/or line CDs, improved performance, increased circuit density, increased productivity, and fewer manufacturing defects may be realized.

Although the present invention has been described and illustrated in detail, it is to be clearly understood that the same is by way of illustration and example only and is not to be taken by way of limitation, the spirit and scope of the present invention being limited only by the terms of the appended claims.

What is claimed is:

1. A method for forming a gate structure from a semiconductor wafer stack comprising a substrate, a dielectric layer over the substrate, a conductive layer over the dielectric layer, a deposited dual-purpose bottom anti-reflective coating/hardmask material over the conductive layer, and a resist mask on the dual-purpose bottom anti-reflective coating/hardmask material, the method comprising:

etching through selected portions of the dual-purpose bottom anti-reflective coating/hardmask material as defined by one or more etch windows in the resist mask;

etching through selected portions of the gate conductive layer as defined by the extended etch windows in the dual-purpose bottom anti-reflective coating/hardmask material; and etching away the remaining portion of the dual-purpose bottom anti-reflective coating/hardmask material.

2. The method as recited in claim 1, wherein the bottom anti-reflective coating comprises $SiO_xN_y$.

3. The method as recited in claim 2, wherein the method further comprises removing the resist mask before the etching through of selected portions of the gate conductive layer.

4. The method as recited in claim 2, wherein the substrate includes:
- a heavily-doped silicon layer, approximately 2 mm thick; and
- a lightly-doped epitaxial (epi) layer, approximately 4 μm thick.

5. The method as recited in claim 2, wherein the gate dielectric layer includes an oxide layer, approximately 55 Å thick.

6. The method as recited in claim 5, wherein the gate conductive layer includes a polycrystalline silicon layer, approximately 1,700 Å thick.

7. The method as recited in claim 2, wherein the bottom anti-reflective coating is configured to attenuate reflection of waves produced in forming the resist mask.

8. The method as recited in claim 7 wherein the resist mask is formed using deep-UV wavelengths and the bottom anti-reflective coating attenuates wavelengths of approximately 248 nm.

9. A method for forming a gate on a semiconductor substrate using a thin film as both a bottom anti-reflective coating and hardmask, the method comprising:
- creating a wafer stack by forming a dielectric layer over the substrate, depositing a conductive layer over the dielectric layer, depositing a bottom anti-reflective coating over the conductive layer, and forming a resist mask on the bottom anti-reflective coating, wherein the resist mask includes at least one etching window;
- creating a hardmask with the bottom anti-reflective coating by anisotropically etching through portions of the bottom anti-reflective coating as exposed through the etching window and removing the resist mask;
- shaping the wafer stack by sequentially etching the gate conductive layer through one or more extended etch windows in the hardmask; and
- removing the hardmask.

10. The method as recited in claim 9, wherein the bottom anti-reflective coating and the hardmask include $SiO_xN_y$.

11. The method as recited in claim 10, wherein the dielectric layer includes an oxide layer.

12. The method as recited in claim 10, wherein the conductive layer includes a polycrystalline silicon layer.

13. The method as recited in claim 10, wherein the bottom anti-reflective coating is configured to attenuate reflections during formation of the resist mask.

14. The method as recited in claim 13 wherein the resist mask is formed using deep-UV wavelengths and the bottom anti-reflective coating attenuates wavelengths of approximately 248 nm.

* * * * *